United States Patent
Onuki et al.

(10) Patent No.: US 9,870,816 B2
(45) Date of Patent: Jan. 16, 2018

(54) METHOD FOR DRIVING SEMICONDUCTOR DEVICE

(71) Applicant: SEMICONDUCTOR ENERGY LABORATORY CO., LTD., Atsugi-shi, Kanagawa-ken (JP)

(72) Inventors: Tatsuya Onuki, Kanagawa (JP); Kiyoshi Kato, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/527,310

(22) Filed: Oct. 29, 2014

(65) Prior Publication Data
US 2015/0117093 A1   Apr. 30, 2015

(30) Foreign Application Priority Data
Oct. 31, 2013 (JP) .................................. 2013-227349

(51) Int. Cl.
*G11C 11/404* (2006.01)
*G11C 11/417* (2006.01)
(Continued)

(52) U.S. Cl.
CPC .......... *G11C 11/417* (2013.01); *G11C 11/412* (2013.01); *G11C 11/404* (2013.01); *G11C 11/405* (2013.01); *H01L 27/108* (2013.01)

(58) Field of Classification Search
CPC .... G11C 11/404; G11C 11/405; H01L 27/108
(Continued)

(56) References Cited

U.S. PATENT DOCUMENTS 4,809,225 A * 2/1989 Dimmler ................. G11C 11/22
  365/149
5,731,856 A    3/1998 Kim et al.
(Continued)

FOREIGN PATENT DOCUMENTS

EP    1737044 A    12/2006
EP    2226847 A     9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Jason Lappas
(74) *Attorney, Agent, or Firm* — Fish & Richardson P.C.

(57) ABSTRACT

A semiconductor device includes SRAM that stores data in an inverter loop including a CMOS inverter, transistors electrically connected to an input terminal or an output terminal of the CMOS inverter, and capacitors electrically connected to the corresponding transistors. The semiconductor device is configured to hold potentials corresponding to data at nodes between the transistors and the corresponding capacitors in a period during which supply of power to the CMOS inverter stops. In the period during which power supply stops, the potential of a wiring applying a low power supply potential is made equal to a high power supply potential to make the potentials of the input and output terminals of the CMOS inverter equal to the high power supply potential. The potentials corresponding to the data held at the nodes are applied to the input and output terminals of the CMOS inverter to restart power supply.

7 Claims, 15 Drawing Sheets

(51) Int. Cl.
  *G11C 11/412* (2006.01)
  *H01L 27/108* (2006.01)
  *G11C 11/405* (2006.01)

(58) Field of Classification Search
  USPC .......................................................... 365/149
  See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0068335 A1 | 3/2011 | Yamazaki et al. |
| 2011/0089419 A1 | 4/2011 | Yamazaki et al. |
| 2011/0188287 A1* | 8/2011 | Kim ........................ G11C 11/22 365/145 |
| 2012/0099360 A1 | 4/2012 | Takemura |
| 2012/0294068 A1 | 11/2012 | Ishizu |
| 2012/0294102 A1 | 11/2012 | Ishizu |
| 2013/0223135 A1 | 8/2013 | Koyama |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and SC2O3—A2O3—Bo System [A; Fe, Ga, or Al; B: Mg, Mn, Fe, Ni, Cu, or Zn] at Temperatures Over 1000°C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3-Ga2ZnO4-ZnO system at 1350°C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

METHOD FOR DRIVING SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a memory device, a driving method thereof, or a manufacturing method thereof. The present invention relates specifically to a semiconductor device and a method for driving the semiconductor device.

2. Description of the Related Art

Much attention has been focused on a semiconductor device that retains data by using a combination of a transistor in which silicon (Si) is used for a semiconductor layer (Si transistor) and a transistor in which an oxide semiconductor (OS) is used for a semiconductor layer (OS transistor) (see Patent Document 1).

Patent Document 1 discloses a semiconductor device in which power gating can be performed because data is retained even while application of power supply voltage stops.

REFERENCE

Patent Document 1: United States Patent Application Publication No. 2013/0223135

However, further scaling down of transistors included in the semiconductor device makes it more difficult for the semiconductor device to operate normally because of effects of on-state current of the OS transistor, leakage current of the Si transistor, capacitance of a capacitor, potential of a power supply line, or the like.

The above issue is resolved by increasing the on-state current of the OS transistor, reducing the leakage current of the Si transistor, increasing the capacitance, or increasing the potential of a power supply line, for example; however, such measures result in larger area of the semiconductor device or shorter data retention time.

In view of the above, an object of one embodiment of the present invention is to provide a method for driving a semiconductor device to achieve normal operation without measures to increase the on-state current of an OS transistor. Another object of one embodiment of the present invention is to provide a method for driving a semiconductor device to achieve normal operation without measures to reduce the leakage current of a Si transistor. Another object of one embodiment of the present invention is to provide a method for driving a semiconductor device to achieve normal operation without measures to increase capacitance. Another object of one embodiment of the present invention is to provide a method for driving a semiconductor device to achieve normal operation without measures to increase the potential of a power supply line. Another object of one embodiment of the present invention is to provide a novel method for driving a semiconductor device or the like.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

SUMMARY OF THE INVENTION

One embodiment of the present invention is a method for driving a semiconductor device that includes a static random access memory for storing data in an inverter loop including a CMOS inverter, a first transistor electrically connected to an input terminal of the CMOS inverter, a second transistor electrically connected to an output terminal of the CMOS inverter, a first capacitor electrically connected to the first transistor, and a second capacitor electrically connected to the second transistor. The semiconductor device is configured to hold potentials corresponding to the data at a first node between the first transistor and the first capacitor and a second node between the second transistor and the second capacitor in a period during which supply of power to the CMOS inverter stops. In the period during which power supply stops, a wiring applying a low power supply potential is made electrically floating, and the potential of the input terminal and the output terminal of the CMOS inverter are made equal to a high power supply potential. Potentials corresponding to the data held at the first node and the second node are applied to the input terminal and the output terminal of the CMOS inverter to restart power supply.

One embodiment of the present invention can provide a method for driving a semiconductor device to achieve normal operation without measures to increase the on-state current of an OS transistor. Alternatively, one embodiment of the present invention can provide a method for driving a semiconductor device to achieve normal operation without measures to reduce the leakage current of a Si transistor. One embodiment of the present invention can provide a method for driving a semiconductor device to achieve normal operation without measures to increase capacitance. One embodiment of the present invention can provide a method for driving a semiconductor device to achieve normal operation without measures to increase the potential of a power supply line. Alternatively, one embodiment of the present invention can provide a novel method for driving a semiconductor device or the like.

Note that effects of one embodiment of the present invention are not limited to the above. For example, depending on circumstances or conditions, one embodiment of the present invention might produce another effect or might not produce any of the above effects.

BRIEF DESCRIPTION OF THE DRAWINGS

In the accompanying drawings.

DETAILED DESCRIPTION OF THE INVENTION

Figure 1A:
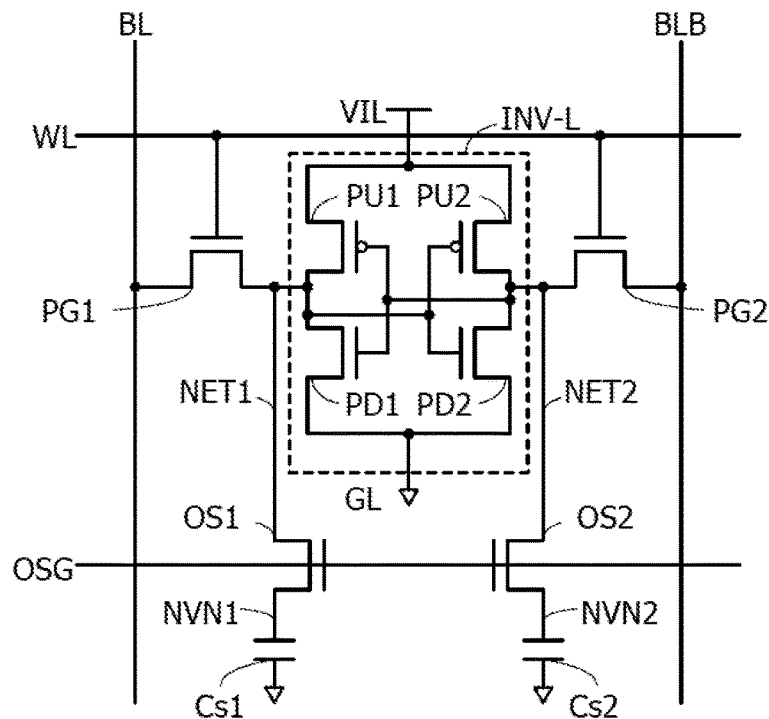
FIGS. 1A and 1B are a circuit diagram and a timing chart of a semiconductor device.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification and the like, ordinal numbers such as first, second, and third are used to avoid confusion among components, and thus do not limit the number of the components.

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

In this specification and the like, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

In this specification and the like, the positional relations of circuit blocks in a drawing are specified for description. Even when a drawing shows that different functions are achieved by different circuit blocks, the circuit blocks in an actual circuit or an actual region may be provided in the same circuit or the same region to achieve different functions. Functions of circuit blocks in a drawing are specified for description, and even when a drawing shows one circuit block performing given processing, a plurality of circuit blocks may be provided in an actual circuit or an actual region to perform the processing.

In this specification and the like, voltage often refers to a difference between a given potential and a reference potential (e.g., a ground potential). Accordingly, voltage, potential, and potential difference can also be referred to as potential, voltage, and voltage difference, respectively. Note that voltage refers to a difference between potentials of two points, and potential refers to electrostatic energy (electric potential energy) of a unit charge at a given point in an electrostatic field.

Note that in general, potential and voltage are relative values; therefore, a ground potential is not always 0 V.

In this specification and the like, the term "parallel" indicates that the angle formed between two straight lines ranges from −10° to 10°, and accordingly also includes the case where the angle ranges from −5° to 5°. The term "perpendicular" indicates that the angle formed between two straight lines ranges from 80° to 100°, and accordingly also includes the case where the angle ranges from 85° to 95°.

In this specification and the like, the trigonal and rhombohedral crystal systems are included in the hexagonal crystal system.

Embodiment 1

In this embodiment, a circuit configuration and operation of a semiconductor device according to one embodiment of the disclosed invention will be described with reference to FIGS. 1A and 1B, FIG. 2, FIGS. 3A and 3B, FIGS. 4A and 4B, FIGS. 5A and 5B, FIGS. 6A and 6B, FIGS. 7A and 7B, and FIGS. 12 to 15.

Note that a semiconductor device refers to a device including a semiconductor element. The semiconductor device includes a driver circuit for driving a circuit including a semiconductor element, for example. Note that the semiconductor device may include a driver circuit, a power supply circuit, or the like provided over another substrate.

One embodiment of the present invention relates to operation of a semiconductor device, particularly to operation for stop and restart of application of power supply voltage. First, a circuit configuration of a semiconductor device will be shown, and then a brief explanation of the operation of the semiconductor device will be given, followed by a detailed explanation of operation for stop and restart of application of power supply voltage.

<Circuit Configuration of Semiconductor Device>

FIG. 1A is a circuit diagram showing an example of a semiconductor device 100. The semiconductor device 100 in FIG. 1A is configured to function as a memory element.

The semiconductor device 100 illustrated in FIG. 1A includes a plurality of transistors that control data writing and reading with a bit line BL, an inverted bit line BLB, a word line WL, and a selection line OSG. In FIG. 1A, the semiconductor device 100 includes a transistor PG1, a transistor PG2, a transistor PD1, a transistor PD2, a transistor PU1, a transistor PU2, a transistor OS1, and a transistor OS2. The semiconductor device 100 in FIG. 1A also includes a capacitor Cs1 and a capacitor Cs2.

In the semiconductor device 100 of FIG. 1A, the transistors PD1 and PU1 and the transistors PD2 and PU2 configure CMOS inverters that form an inverter loop INV-L. In FIG. 1A, nodes serving as an input terminal and an output terminal of the CMOS inverter are denoted by a node NET1 and a node NET2.

In the semiconductor device 100, a combination of the inverter loop INV-L and the transistors PG1 and PG2 serving as switches forms a circuit functioning as static random access memory (SRAM) where data is stored in the inverter loop INV-L.

In the semiconductor device 100 in FIG. 1A, a potential VDD and a potential GND are applied to the CMOS inverters as a high power supply potential and a low power supply potential, respectively, to apply the power supply voltage. In FIG. 1A, a wiring applying the high power supply potential is shown as a wiring VIL, and a wiring applying the low power supply potential is shown as a wiring GL.

In the semiconductor device 100 in FIG. 1A, a node connecting the transistor OS1 and the capacitor Cs1 is indicated by a node NVN1, and a node connecting the transistor OS2 and the capacitor Cs2 is indicated by a node NVN2.

In the semiconductor device 100, the transistor PG1, the transistor PG2, the transistor PD1, the transistor PD2, the transistor PU1, and the transistor PU2 are preferably Si transistors, in which silicon is used for a semiconductor layer serving as a channel formation region. The transistor OS1 and the transistor OS2 are preferably OS transistors, in which an oxide semiconductor is used for a semiconductor layer serving as a channel formation region.

In the semiconductor device 100 including Si transistors and OS transistors, the OS transistors can be stacked over the Si transistors, in which case the area occupied by the transistors can be reduced, resulting in a reduction in the size of the semiconductor device 100.

The OS transistor used in the semiconductor device 100 is preferably used as a transistor in which current flowing between a source and drain in the off state (off-state current) is low. Here, the term "low off-state current" means that a normalized off-state current per micrometer of a channel width at room temperature with a source-drain voltage of 10 V is less than or equal to 10 zA.

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to off-state current at given Vgs, off-state current at Vgs in a given range, or off-state current at Vgs at which sufficiently low off-state current is obtained.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 µm). In the latter case, the unit of off-state current may be represented by current per length (e.g., A/µm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

Since the OS transistors used in the semiconductor device 100 are transistors with low off-state current, turning off the OS transistors enables charge corresponding to data to be held at the node NVN1 and the node NVN2 between the OS transistors and the capacitors Cs1 and Cs2. This charge retention is achieved by turning off the OS transistors, and application of the power supply voltage for data retention is not required at all times. Thus, the node NVN1 and the node NVN2 can hold data while application of the power supply voltage to the semiconductor device 100 stops; thus, data stored in the semiconductor device 100 can be nonvolatile.

<Brief Explanation of Operation of Semiconductor Device>

Next, the operation of the semiconductor device 100 functioning as a memory element will be briefly described.

Figure 1B:
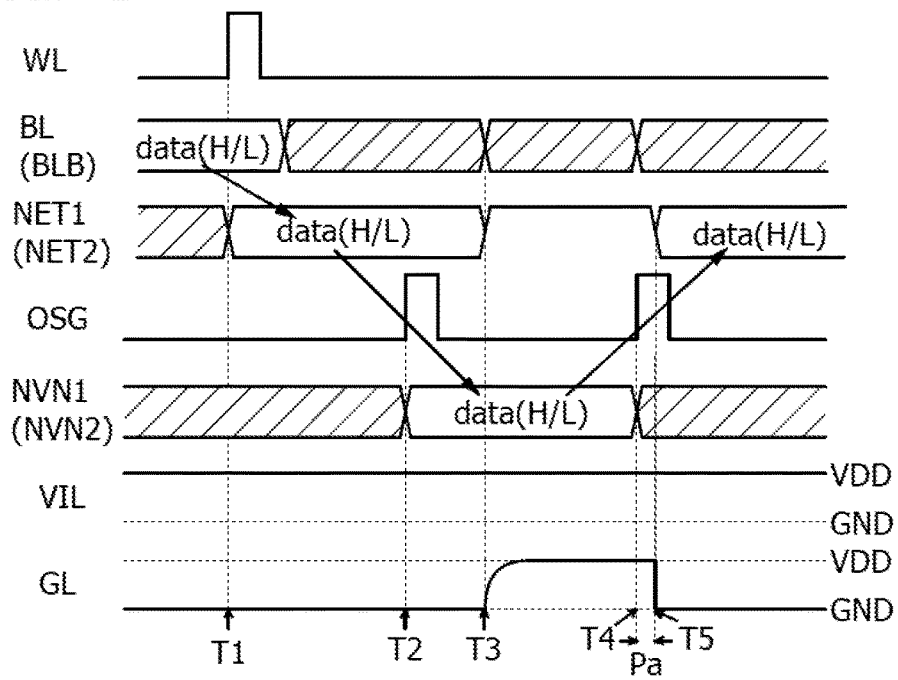

A timing chart in FIG. 1B shows changes in signals and potentials of the word line WL, the bit line BL (or the inverted bit line BLB), the node NET1 (or the node NET2), the selection line OSG, the node NVN1 (or the node NVN2), the wiring VIL, and the wiring GL illustrated in FIG. 1A. Note that in FIG. 1B, a hatch pattern is used to omit description because a signal is actually supplied in a hatched period but description of operation therein is unnecessary here.

First, at time T1, the potential of the word line WL is set high, and data corresponding to a high-level or low-level potential (shown as data(H/L) in diagrams) that is applied to the bit line BL is supplied to the node NET1 through the transistor PG1. Via the inverted bit line BLB, data corresponding to a potential opposite to that applied to the bit line BL is supplied to the node NET2 through the transistor PG2. Data applied from the bit line BL and the inverted bit line BLB are held in the inverter loop INV-L in the semiconductor device 100. The semiconductor device 100 is supplied with the power supply voltage from the wiring VIL and the wiring GL and can hold the potentials at the node NET1 and the node NET2.

Next, at time T2, the potential of the selection line OSG is set high, and data applied to the node NET1 or the node NET2 is supplied to the node NVN1 or the node NVN2 through the transistor OS1 or the transistor OS2. Note that data transfer from the node NET1 or the node NET2 to the node NVN1 or the node NVN2 at time T2 is referred to as data storing or data saving.

Note that the high-level potential of the selection line OSG is preferably higher than the potential VDD, in which case the transistor OS1 and the transistor OS2 can operate as switches and a potential held at the node NVN1 and the node NVN2 can be prevented from decreasing at the time of data saving.

Then, at time T3, the wiring GL is made electrically floating, whereby the potential of the wiring GL becomes the potential VDD, and application of the power supply voltage to the inverter loop INV-L stops as a result. When application of the power supply voltage stops, the potentials of the node NET1 and the node NET2 become the potential VDD, which is equal to the potential of the wiring VIL. Thus, although data at the node NET1 and the node NET2 are lost, data at the node NVN1 and the node NVN2 can be maintained by turning off the transistor OS1 and the transistor OS2 with ultralow off-state current.

Figure 12:
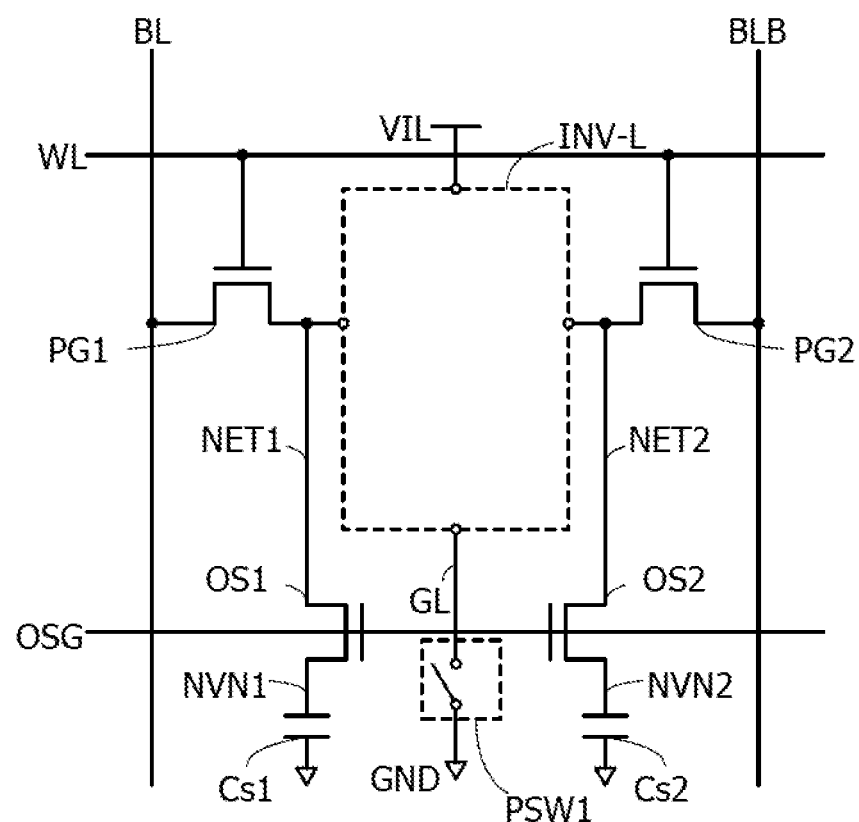
FIG. 12 is a circuit diagram of a semiconductor device.

A configuration in a circuit diagram of FIG. 12 can be employed to make the wiring GL electrically floating. In FIG. 12, a switch PSW1 is provided between the wiring GL and a wiring applying the potential GND. In this configuration, the potential of the wiring GL can be set at the potential GND by turning on the switch PSW1, and the wiring GL can be made electrically floating by turning off the switch PSW1. The potential of the wiring GL in an electrically floating state changes from the potential GND to the potential VDD by a current flowing from the wiring VIL. The switch PSW1 preferably includes an n-channel transistor.

Without limitation to the above structure where the wiring GL is made electrically floating, it is possible, for example, that the potential of the wiring GL changes from the potential GND to the potential VDD, which is the potential of the wiring VIL, to stop application of the power supply voltage to the inverter loop INV-L at time T3.

Figure 14:
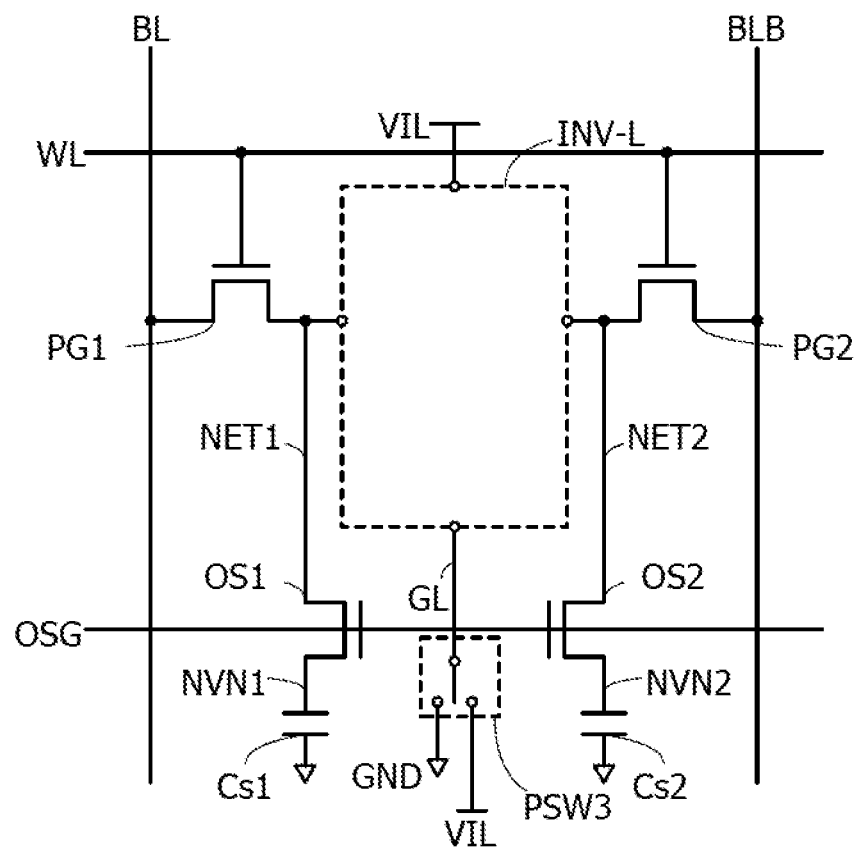
FIG. 14 is a circuit diagram of a semiconductor device.

A configuration in a circuit diagram of FIG. 14 can be employed to change the potential of the wiring GL from the potential GND to the potential VDD, which is the potential of the wiring VIL. In FIG. 14, a switch PSW3 is provided to switch connection of the wiring GL between the wiring VIL and a wiring applying the potential GND. In this configuration, by turning on or off the switch PSW3, the potential of the wiring GL can change to the potential GND or the potential VDD, which is the potential of the wiring VIL; that is, the potential of the wiring GL can switch from the potential GND to the potential VDD. The switch PSW3 preferably includes a multiplexer.

Next, at time T4, the selection line OSG is set high, and the transistor OS1 and the transistor OS2 are turned on. Then, data held at the node NVN1 and the node NVN2 are applied to the node NET1 and the node NET2. Note that data transfer from the node NVN1 or the node NVN2 to the node NET1 or the node NET2 at time T4 is referred to as data restoring. The potentials of the node NET1 and the node NET2 are different from each other because they change depending on the potentials of the node NVN1 and the node NVN2.

Subsequently, at time T5, the potential of the wiring GL switches to the potential GND, and application of the power supply voltage restarts. After application of the power supply voltage restarts, data saved at time T2 is returned on the basis of the potentials of the node NET1 and the node NET2, which differ from each other at time T4. To return the saved data after restart of application of the power supply voltage, it is important for the node NET 1 and the node NET2 to have different potentials based on the potentials of the node NVN1 and the node NVN2.

<Operation in One Embodiment of the Present Invention for Stop and Restart of Application of Power Supply Voltage>

One embodiment of the present invention relates to data restoring at the time of stopping and restarting application of the power supply voltage. Here, a detailed description is made on operation for data restoring in a period from change of the potential of the selection line OSG to a high-level potential until restart of application of the power supply voltage (i.e., a period Pa in FIG. 1B).

Figure 2:
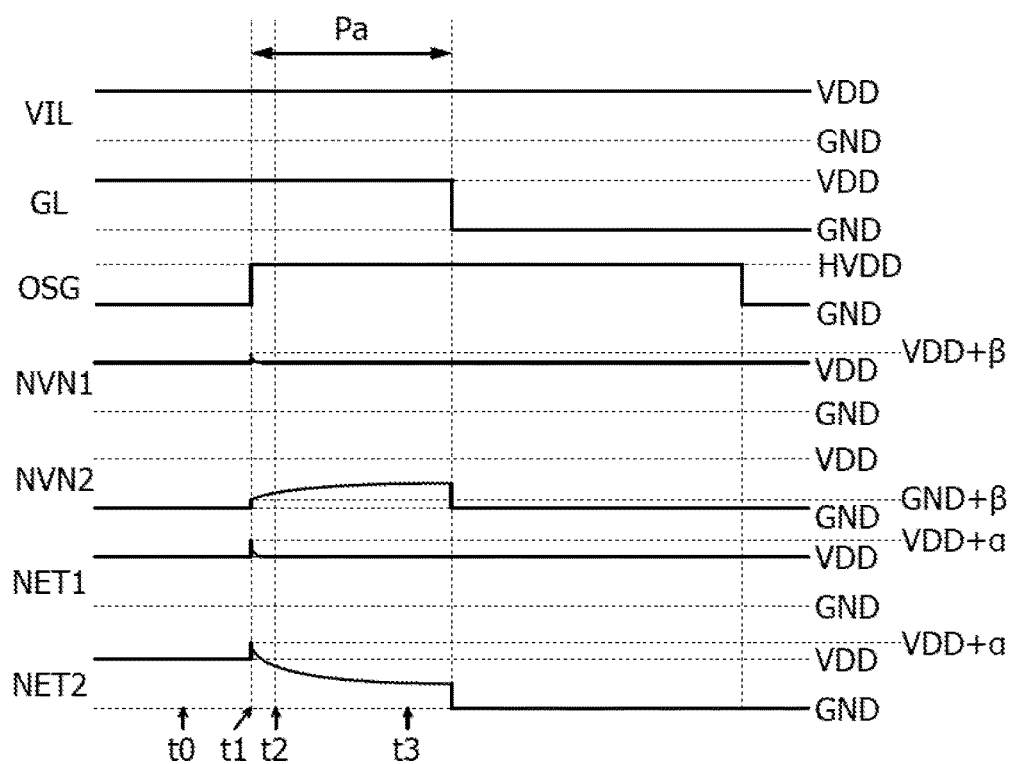
FIG. 2 is a timing chart of a semiconductor device.

A timing chart in FIG. 2 shows changes in signals and potentials of the wiring VIL, the wiring GL, the selection line OSG, the node NVN1, the node NVN2, the node NET1, and the node NET2 in the period Pa of FIG. 1B. FIGS. 3A and 3B and FIGS. 4A and 4B show circuit diagrams in which the potentials of the wirings and the nodes at time t0 to time t3 in the timing chart of FIG. 2 are written for easy understanding. The timing chart in FIG. 2 shows an example where the potential VDD, which is the high-level potential, is held at the node NVN1 and the potential GND, which is the low-level potential, is held at the node NVN2. In FIG. 2, a high-level potential of the selection line OSG is represented by HVDD to indicate that it is higher than the potential VDD.

First, time t0 represents time at which application of the power supply voltage stops as an initial state. In other words, at time t0, since the wiring GL is electrically floating, the potential of the wiring GL is the potential VDD, which is the potential of the wiring VIL, and application of the power supply voltage to the inverter loop INV-L stops. When application of the power supply voltage stops, the potentials of the node NET1 and the node NET2 become the potential VDD. The potential VDD is held at the node NVN1, and the ground GND is held at the node NVN2. Since the selection line OSG has the potential GND, which is the low-level potential, turning off the transistor OS1 and the transistor OS2, which exhibit ultralow off-state current, allows the potentials of the node NVN1 and the node NVN2 to be maintained.

Figure 3A:
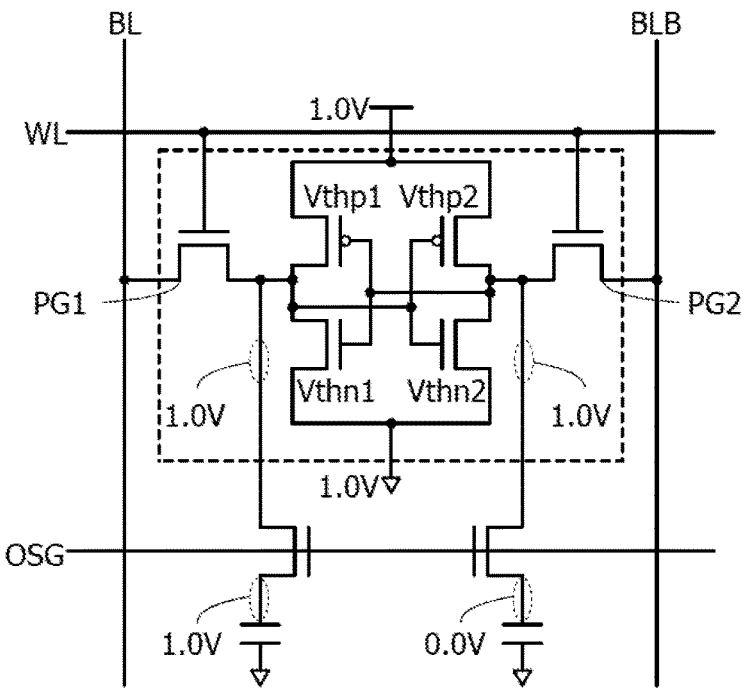
FIGS. 3A and 3B are circuit diagrams of a semiconductor device.

Assuming that the potential VDD is 1.0 V and the potential GND is 0.0 V, the potentials of the wirings and the nodes in the semiconductor device 100 at time t0 are as shown in FIG. 3A. Specifically, the wiring VIL, the wiring GL, the node NET1, the node NET2, and the node NVN1 have 1.0 V and the node NVN2 has 0.0 V.

FIG. 3A shows the threshold voltages of the transistor PU1, the transistor PU2, the transistor PD1, and the transistor PD2 as Vthp1, Vthp2, Vthn1, and Vthn2, respectively. The threshold voltages Vthp1, Vthp2, Vthn1, and Vthn2 may vary depending on a fabrication process or the like. The following description is made on the assumption that the threshold voltages vary; specifically, Vthp1 is −0.5 V, Vthp2 is −0.4 V, Vthn1 is 0.4 V, and Vthn2 is 0.5 V. Note that the threshold voltage variation is preferably small but is significantly increased with a reduction in size of the semiconductor device 100. Although specific threshold voltage values of the transistors are used to describe this embodiment, the threshold voltages are not limited to these values. Note that threshold voltages of transistors included in a semiconductor device are more likely to vary as a finer fabrication process is employed.

Next, to restore data, the selection line OSG is set at the high-level potential HVDD, and the transistor OS1 and the transistor OS2 are turned on. By switching the potential of the selection line OSG from the potential GND to the potential HVDD, the potentials of the node NET1, the node NET2, the node NVN1, and the node NVN2 vary depending on capacitive coupling due to parasitic capacitance between the gate and source and between the gate and drain of the transistor OS1 and the transistor OS2. In the following description, the potential HVDD is 1.8 V.

The amount of variation in the potential of each node caused by capacitive coupling due to parasitic capacitance depends on the capacitance of each node. For example, α>β, where α is the amount of variation in the potential of the node NET1 and the node NET2 due to capacitive coupling and β is the amount of variation in the potential of the node NVN1 and the node NVN2 due to capacitive coupling. This is because the node NET1 and the node NET2, which are not connected to the capacitor Cs1 and the capacitor Cs2, have a smaller capacitance and larger potential variation due to capacitive coupling than the node NVN1 and the node NVN2, which are connected to the capacitor Cs1 and the capacitor Cs2.

Figure 3B:
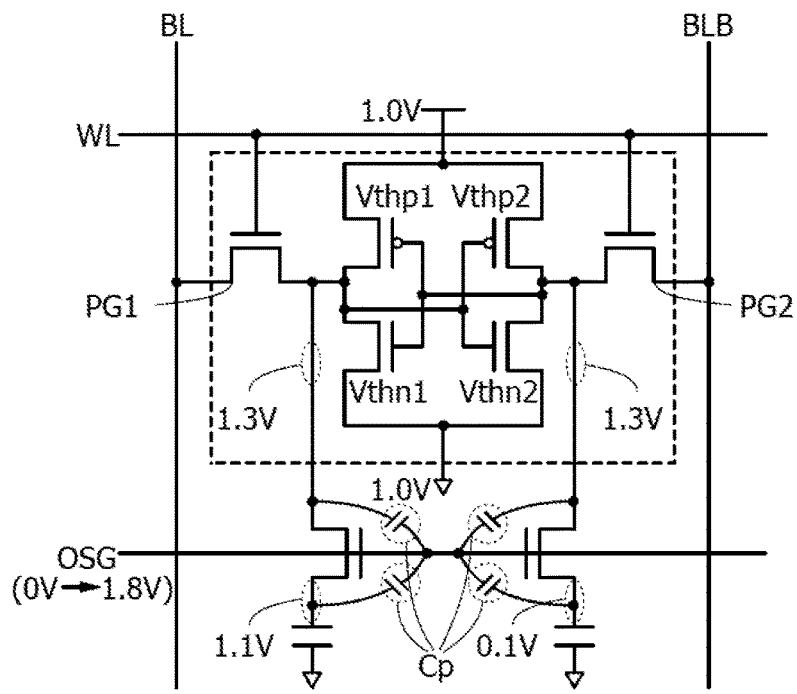

The potentials of the wirings and the nodes in the semiconductor device 100 at time t1 are as shown in FIG. 3B. Specifically, the wiring VIL and the wiring GL have 1.0 V; the node NET1 and the node NET2 have 1.3 V; the node NVN1 has 1.1 V; and the node NVN2 has 0.1 V. In FIG. 3B, parasitic capacitance between the gate and source and between the gate and drain of the transistor OS1 and the transistor OS2 is denoted by Cp. The increase in the potential of the node NET1, the node NET2, the node NVN1, and the node NVN2 is caused by a potential variation due to the capacitive coupling described above.

At time t1, in the state illustrated in FIG. 3B, the gate-source voltages Vgs of the transistor PU1 and the transistor PU2 are 0 V. Furthermore, Vgs of the transistor PD1 and the transistor PD2 are 0.3 V.

At this time, the difference between Vgs and Vthp1 of the transistor PU1 is 0.5 V. The difference between Vgs and Vthp2 of the transistor PU2 is 0.4 V. The difference between Vgs and Vthn1 of the transistor PD1 is −0.1 V. The difference between Vgs and Vthn2 of the transistor PD2 is −0.2 V. In other words, the absolute value of the difference between Vgs and the threshold voltage of the n-channel transistor is smaller than that of the p-channel transistor, and leakage current is more likely to flow through the n-channel transistor when Vgs varies.

Note that leakage current refers to current that flows slightly in an off-state transistor. Here, the off-state current at Vgs of around 0 V depends on a subthreshold swing (S value) or the like of a transistor. With a small S value, leakage current is low even at Vgs of around 0 V, whereas with a large S value, leakage current is high at Vgs of around 0 V or higher; thus, leakage current at Vgs of around 0 V is required to be estimated in accordance with transistor characteristics.

Vgs varies with the increase in the potentials of the node NET1 and the node NET2. The Vgs variation facilitates flow of leakage current through the transistor PD1 and the transistor PD2, which are n-channel transistors. The potential of the node NET1 decreases gradually toward the potential VDD of the wiring GL and then reaches the potential VDD.

From time t1 to time t2, leakage current is more likely to flow through the n-channel transistor than through the p-channel transistor. For this reason, the potentials of the node NET1 and the node NET2 can decrease properly to 1.0 V, which is the potential VDD of the wiring VIL. According to one embodiment of the present invention, a method for driving a semiconductor device enabling normal operation is obtained without measures to increase the on-state current of the OS transistor for reducing the potentials of the node NET1 and the node NET2.

In the configuration of this embodiment, as for the transistor PD1, the transistor PU1, the transistor PD2, and the transistor PU2 that constitute the CMOS inverters, the n-channel transistors are preferably larger in size than the p-channel transistors. With such a structure, leakage current that occurs from time t1 to time t2 can be intentionally increased, and the potentials of the node NET1 and the node NET2 can properly decrease to 1.0 V, which is the potential VDD of the wiring VIL. Furthermore, static noise margin of SRAM can be increased.

Figure 4A:
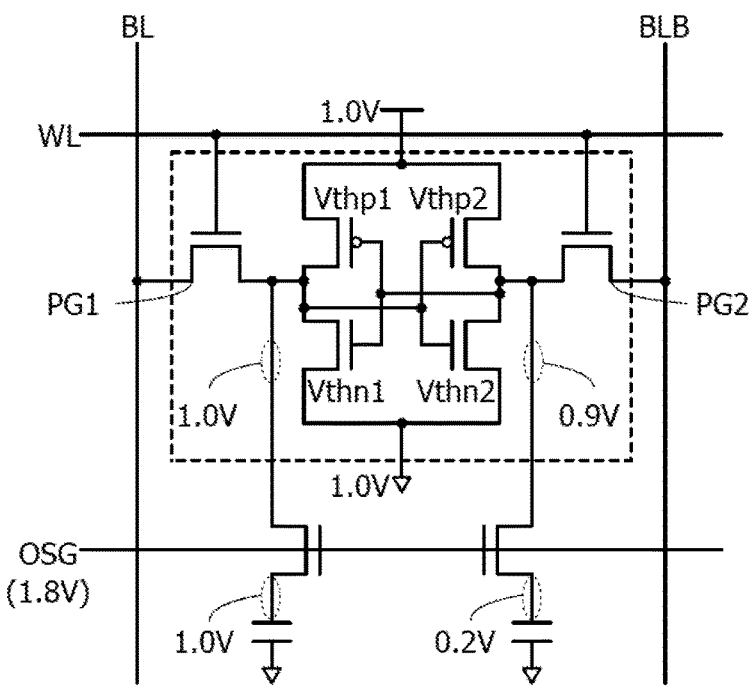
FIGS. 4A and 4B are circuit diagrams of a semiconductor device.

The potentials of the wirings and the nodes in the semiconductor device 100 at time t2 are as shown in FIG. 4A. Specifically, the wiring VIL, the wiring GL, and the node NET1 have 1.0 V; the node NET2 has 0.9 V; the node NVN1 has 1.0 V; and the node NVN2 has 0.2 V.

At time t2, in the state illustrated in FIG. 4A, Vgs of the transistor PU1 is −0.1 V; Vgs of the transistor PU2 is 0 V; Vgs of the transistor PD1 is −0.1 V; and Vgs of the transistor PD2 is 0.1 V.

At this time, the difference between Vgs and Vthp1 of the transistor PU1 is 0.4 V. The difference between Vgs and Vthp2 of the transistor PU2 is 0.4 V. The difference between Vgs and Vthn1 of the transistor PD1 is −0.5 V. The difference between Vgs and Vthn2 of the transistor PD2 is −0.4

V. In other words, leakage current is less likely to flow through both the p-channel transistor and the n-channel transistor.

Accordingly, a potential change due to exchange of charge between the node NET2 and the node NVN2 is likely to occur. As a result, the potential of the node NVN2 is not affected by the transistor PD2 involved in a potential rise, and the potential of the node NET2 can decrease toward the potential GND. According to one embodiment of the present invention, a method for driving a semiconductor device achieving normal operation is obtained without measures to reduce the leakage current of the Si transistor, increase the capacitance, or increase the potential of a power supply line for lowering the potential of the node NET2.

Figure 4B:
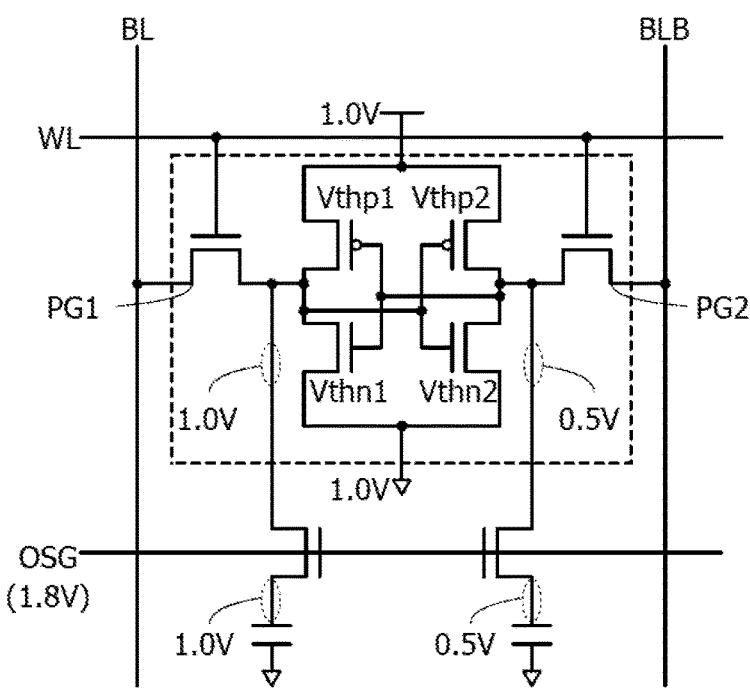

At time t3, in the state illustrated in FIG. 4B, the potential of the node NET2 is 0.5 V. Then, after a lapse of time, the potential of the node NET2 rises because of leakage current of the Si transistor. For this reason, it is preferable to set the potential of the wiring GL at the potential GND to restart application of the power supply voltage when the potential difference between the node NET1 and the node NET2 becomes a difference with which data can be restored.

In the case of the above-described driving method for the semiconductor device in one embodiment of the present invention, the semiconductor device includes SRAM that stores data in an inverter loop including CMOS inverters, a transistor electrically connected to input terminals of the CMOS inverters, a transistor electrically connected to output terminals of the CMOS inverters, and capacitors electrically connected to the corresponding transistors. In the driving method for the semiconductor device that is configured to hold potentials corresponding to data at nodes between the transistors and the corresponding capacitors in a period during which supply of power to the CMOS inverters stops, a wiring applying a low power supply potential is made electrically floating in the period during which power supply stops to set the potentials of the input and output terminals of the CMOS inverters at a high power supply potential. The potentials corresponding to the data held at the nodes are applied to the input and output terminals of the CMOS inverters to restart power supply.

The method for driving the semiconductor device in one embodiment of the present invention achieves normal operation without measures to increase the on-state current of the OS transistor, reduce the leakage current of the Si transistor, increase the capacitance, or increase the potential of a power supply line.

Here, to make a comparison with the method for driving the semiconductor device in one embodiment of the present invention, the following operation will be described as an example with reference to FIGS. 5A and 5B, FIGS. 6A and 6B, and FIGS. 7A and 7B in the same way as FIGS. 1A and 1B, FIG. 2, FIGS. 3A and 3B, and FIGS. 4A and 4B. Specifically, in a period during which power supply stops, a wiring applying the high power supply potential is set electrically floating and the potentials of the input and output terminals of the CMOS inverters are made equal to the low power supply potential, and potentials corresponding to data held at the nodes are applied to the input and output terminals of the CMOS inverters to restart power supply.

<Brief Explanation of Comparative Operation of Semiconductor Device>

Figure 5A:
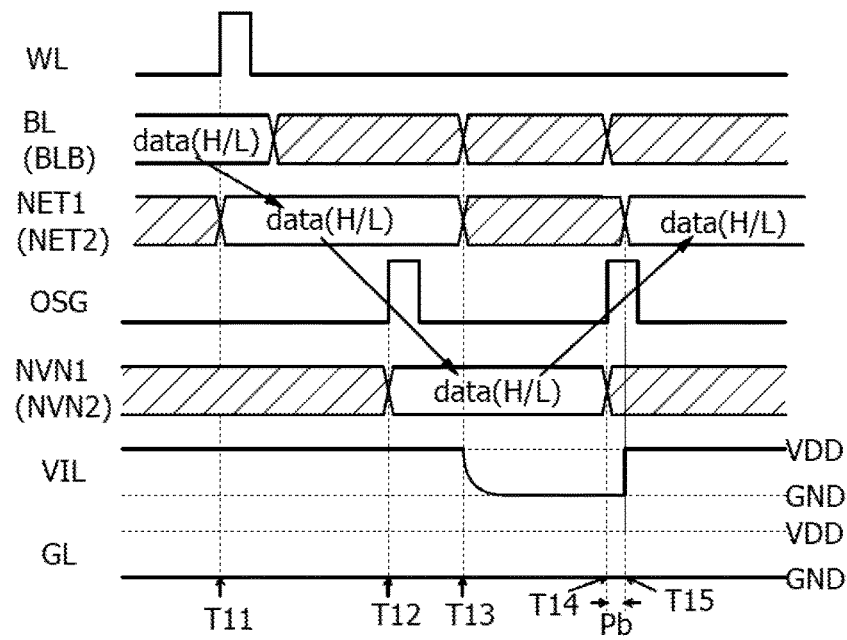
FIGS. 5A and 5B are timing charts of a semiconductor device.

Like FIG. 1B, FIG. 5A briefly shows the operation of the semiconductor device 100 in the comparative example.

Operation at time T11 and time T12 is similar to that at time T1 and time T2 in FIG. 1B; therefore, description is omitted here and the above description is to be referred to.

Then, at time T13, the wiring VIL is made electrically floating, whereby the potential of the wiring VIL becomes the potential GND, and application of the power supply voltage to the inverter loop INV-L stops as a result. When application of the power supply voltage stops, the potentials of the node NET1 and the node NET2 become the potential GND, which is equal to the potential of the wiring GL.

Figure 13:
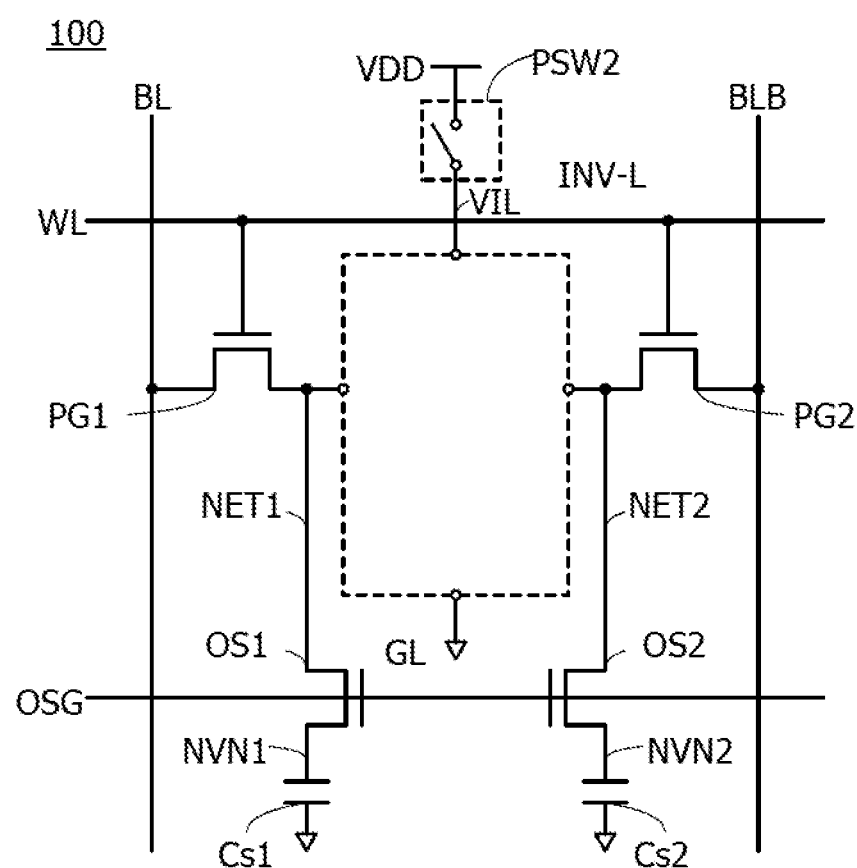
FIG. 13 is a circuit diagram of a semiconductor device.

A configuration in a circuit diagram of FIG. 13 can be employed to make the wiring VIL electrically floating. In FIG. 13, a switch PSW2 is provided between the wiring VIL and a wiring applying the potential VDD. In this configuration, the potential of the wiring VIL can be set at the potential VDD by turning on the switch PSW2, and the wiring VIL can be made electrically floating by turning off the switch PSW2. The potential of the wiring VIL in an electrically floating state changes from the potential VDD to the potential GND by a current flowing from the wiring GL. The switch PSW2 preferably includes a p-channel transistor.

Without limitation to the above structure where the wiring VIL is made electrically floating, it is possible, for example, that the potential of the wiring VIL changes from the potential VDD to the potential GND, which is the potential of the wiring GL, to stop application of the power supply voltage to the inverter loop INV-L at time T13.

Figure 15:
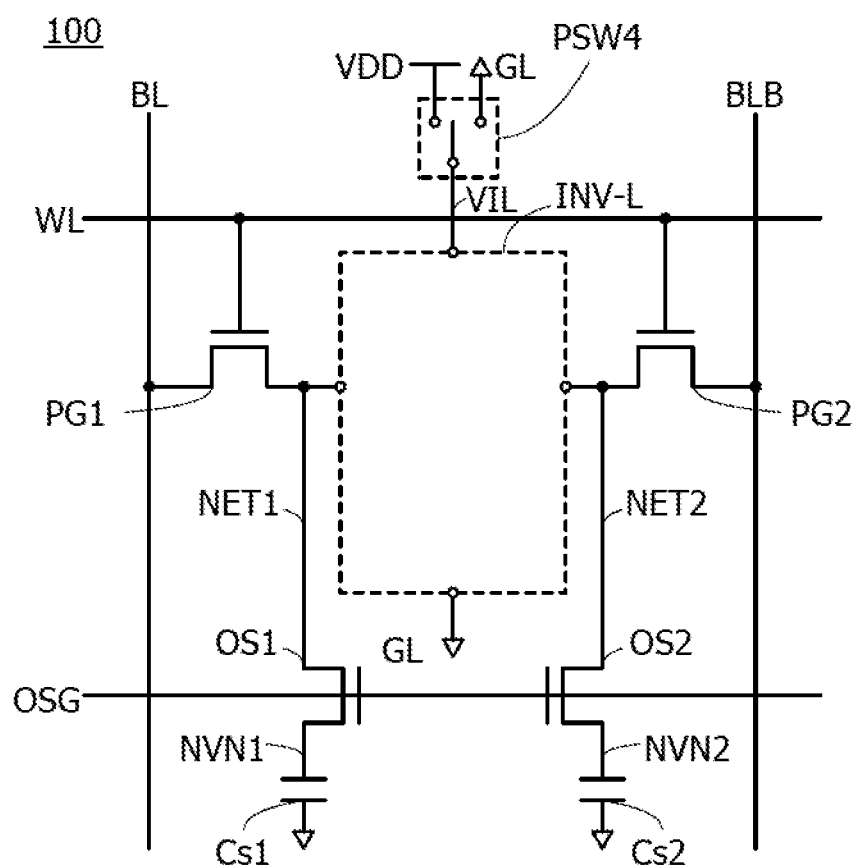
FIG. 15 is a circuit diagram of a semiconductor device.

A configuration in a circuit diagram of FIG. 15 can be employed to change the potential of the wiring VIL from the potential VDD to the potential GND, which is the potential of the wiring GL. In FIG. 15, a switch PSW4 is provided to switch connection of the wiring VIL between the wiring GL and a wiring applying the potential VDD. In this configuration, by turning on or off the switch PSW4, the potential of the wiring VIL can change to the potential VDD or the potential GND, which is the potential of the wiring GL; that is, the potential of the wiring VIL can switch from the potential VDD to the potential GND. The switch PSW4 preferably includes a multiplexer.

Next, at time T14, the selection line OSG is set high, and the transistor OS1 and the transistor OS2 are turned on. Then, data held at the node NVN1 and the node NVN2 are applied to the node NET1 and the node NET2.

Subsequently, at time T15, the potential of the wiring VIL switches to the potential VDD, and application of the power supply voltage restarts. After application of the power supply voltage restarts, data saved at time T12 is returned on the basis of the potentials of the node NET1 and the node NET2, which differ from each other at time T14.

<Comparative Operation for Stop and Restart of Application of Power Supply Voltage>

Figure 5B:
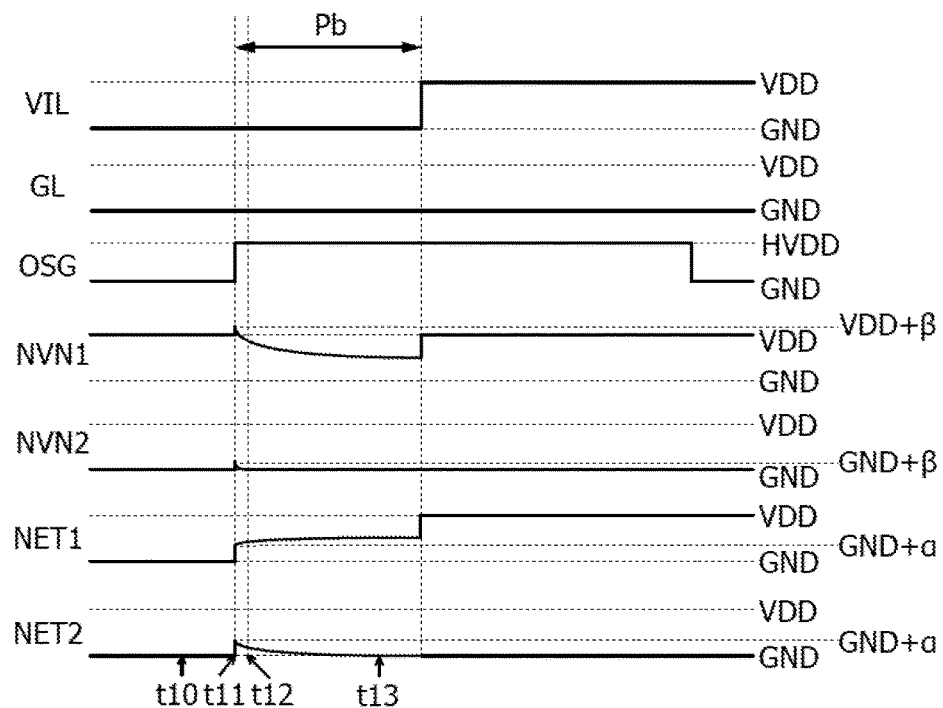

Like FIG. 2, FIG. 5B shows the details of comparative operation of the semiconductor device 100 for data restoring in a period during which the selection line OSG is set high until application of the power supply voltage restarts (i.e., a period Pb in FIG. 5A).

A timing chart in FIG. 5B shows changes in signals and potentials of the wiring VIL, the wiring GL, the selection line OSG, the node NVN1, the node NVN2, the node NET1, and the node NET2 in the period Pb of FIG. 5A. FIGS. 6A and 6B and FIGS. 7A and 7B show circuit diagrams in which the potentials of the wirings and the nodes at time t10 to time t13 in the timing chart of FIG. 5B are written for easy understanding. The timing chart in FIG. 5B shows an example where the potential VDD, which is the high-level potential, is held at the node NVN1 and the potential GND, which is the low-level potential, is held at the node NVN2. In FIG. 5B, a high-level potential of the selection line OSG is represented by HVDD to indicate that it is higher than the potential VDD.

First, time t10 represents time at which application of the power supply voltage stops as an initial state. In other words, since the wiring VIL is electrically floating, the potential of the wiring VIL is the potential GND, which is the potential of the wiring GL, and application of the power supply voltage to the inverter loop INV-L stops. When application of the power supply voltage stops, the potentials of the node NET1 and the node NET2 become the potential GND. The potential VDD is held at the node NVN1, and the ground GND is held at the node NVN2. Since the selection line OSG has the potential GND, which is the low-level potential, turning off the transistor OS1 and the transistor OS2 with ultralow off-state current allows the potentials of the node NVN1 and the node NVN2 to be maintained.

Figure 6A:
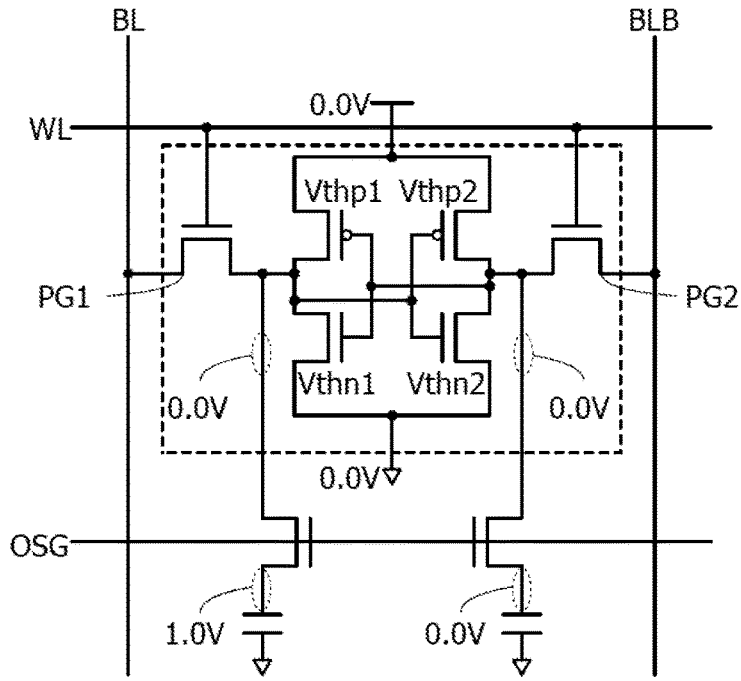
FIGS. 6A and 6B are circuit diagrams of a semiconductor device.

Assuming that the potential VDD is 1.0 V and the potential GND is 0.0 V, the potentials of the wirings and the nodes in the semiconductor device 100 at time t10 are as shown in FIG. 6A. Specifically, the wiring VIL, the wiring GL, the node NET1, and the node NET2 have 0.0 V; the node NVN1 has 1.0 V; and the node NVN2 has 0.0 V.

Like FIG. 3A, FIG. 6A shows the threshold voltages of the transistor PU1, the transistor PU2, the transistor PD1, and the transistor PD2.

Then, to restore data, the selection line OSG is set at the high-level potential HVDD, and the transistor OS1 and the transistor OS2 are turned on. By switching the potential of the selection line OSG from the potential GND to the potential HVDD, the potentials of the node NET1, the node NET2, the node NVN1, and the node NVN2 vary depending on capacitive coupling due to parasitic capacitance between the gate and source and between the gate and drain of the transistor OS1 and the transistor OS2. In the following description, the potential HVDD is 1.8 V.

The amount of variation in the potential of each node caused by capacitive coupling due to parasitic capacitance depends on the capacitance of each node. For example, $\alpha > \beta$, where $\alpha$ is the amount of variation in the potential of the node NET1 and the node NET2 due to capacitive coupling and $\beta$ is the amount of variation in the potential of the node NVN1 and the node NVN2 due to capacitive coupling. This relation is the same as in the description of FIG. 3A.

Figure 6B:
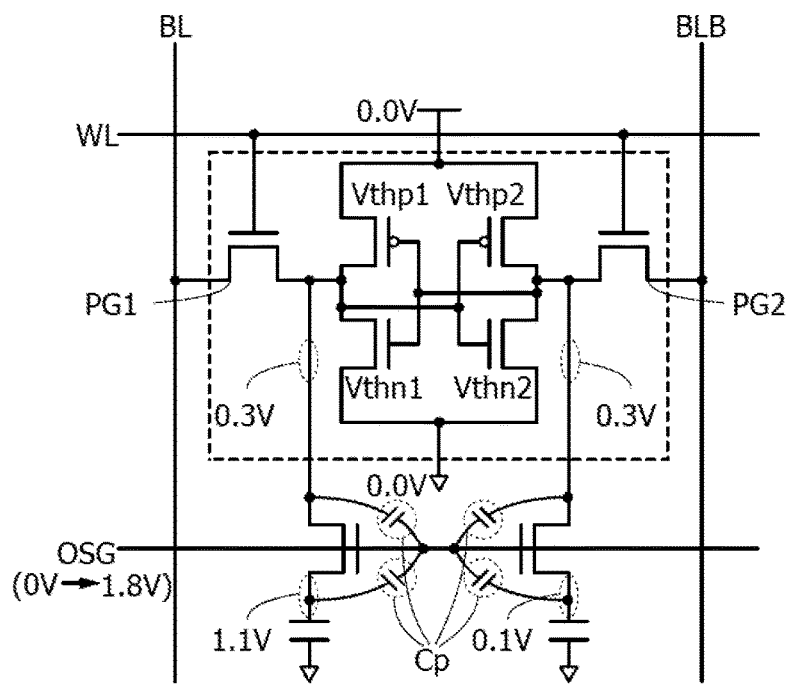

The potentials of the wirings and the nodes in the semiconductor device 100 at time t11 are as shown in FIG. 6B. Specifically, the wiring VIL and the wiring GL have 0.0 V; the node NET1 and the node NET2 have 0.3 V; the node NVN1 has 1.1 V; and the node NVN2 has 0.1 V. In FIG. 6B, the parasitic capacitance Cp is shown as in FIG. 3B. The potentials of the node NET1, the node NET2, the node NVN1, and the node NVN2 are increased by capacitive coupling due to the parasitic capacitance Cp.

At time t11, in the state illustrated in FIG. 6B, Vgs of the transistor PU1 and the transistor PU2 are 0 V, and Vgs of the transistor PD1 and the transistor PD2 are 0.3 V.

At this time, the difference between Vgs and Vthp1 of the transistor PU1 is 0.5 V. The difference between Vgs and Vthp2 of the transistor PU2 is 0.4 V. The difference between Vgs and Vthn1 of the transistor PD1 is −0.1 V. The difference between Vgs and Vthn2 of the transistor PD2 is −0.2 V. In other words, the absolute value of the difference between Vgs and the threshold voltage of the n-channel transistor is smaller than that of the p-channel transistor, and leakage current is more likely to flow through the n-channel transistor when Vgs varies. That is, this state is the same as that at time t1 shown in FIG. 3B.

Then, Vgs varies with the increase in the potentials of the node NET1 and the node NET2. Thus, Vgs variation makes leakage current more likely to flow through the transistor PD1 and the transistor PD2, which are n-channel transistors where current easily flows.

From time t11 to time t12, leakage current is likely to flow through the n-channel transistor. Thus, the potentials of the node NET1 and the node NET2 can easily decrease to 0 V, which is the potential GND of the wiring GL. For this reason, although the potential of the node NET1 is increased by charge transfer from the node NVN1 in the comparative operation, a potential decrease due to leakage current of the Si transistor needs to be considered. Accordingly, the comparative example requires measures to increase the on-state current of the OS transistor, increase the capacitance, or increase the potential of a power supply line or measures to reduce the leakage current of the Si transistor.

Figure 7A:
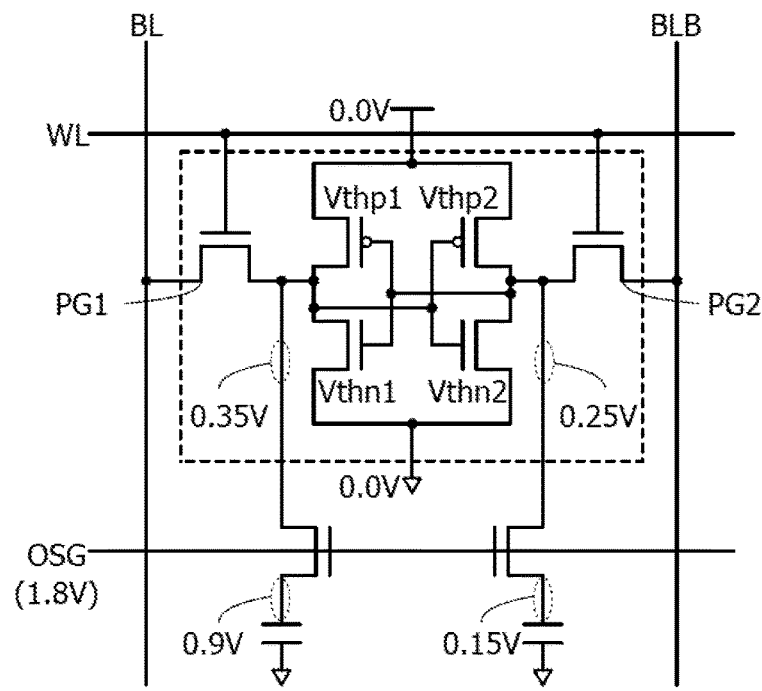
FIGS. 7A and 7B are circuit diagrams of a semiconductor device.

The potentials of the wirings and the nodes in the semiconductor device 100 at time t12 are as shown in FIG. 7A. Specifically, the wiring VIL and the wiring GL have 0.0 V; the node NET1 has 0.35 V; the node NET2 has 0.25 V; the node NVN1 has 0.9 V; and the node NVN2 has 0.15 V.

At time t12, in the state illustrated in FIG. 7A, Vgs of the transistor PU1 is −0.1 V; Vgs of the transistor PU2 is 0.1 V; Vgs of the transistor PD1 is 0.25 V; and Vgs of the transistor PD2 is 0.35 V.

At this time, the difference between Vgs and Vthp1 of the transistor PU1 is 0.4 V. The difference between Vgs and Vthp2 of the transistor PU2 is 0.5 V. The difference between Vgs and Vthn1 of the transistor PD1 is −0.15 V. The difference between Vgs and Vthn2 of the transistor PD2 is −0.15 V. That is, leakage current is more likely to flow through the n-channel transistor than through the p-channel transistor.

Accordingly, the potential of the node NET1 is less likely to be increased because of the leakage current of the transistor PD 1. Thus, a potential difference between the node NET1 and the node NET2 is less likely to occur. To avoid the state where the potential of the node NET1 increases less easily, measures to reduce the leakage current of the Si transistor, increase the capacitance, or increase the potential of a power supply line are required.

Figure 7B:
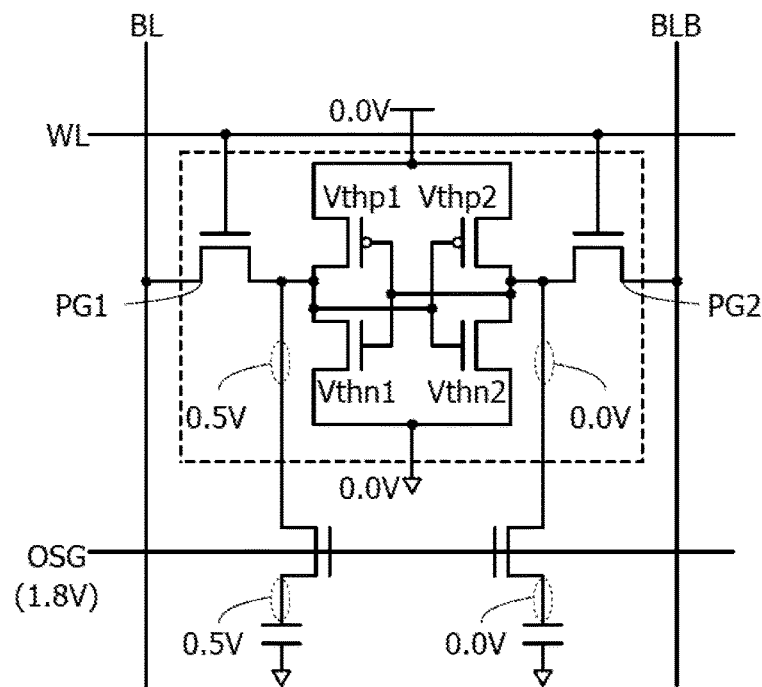

At time t13, in the state illustrated in FIG. 7B, the potential of the node NET1 is 0.5 V and the potential of the node NET2 is 0.0 V.

Comparison of Procedure Between One Embodiment of the Present Invention and Comparative Example In the procedure described using FIGS. 5A and 5B, FIGS. 6A and 6B, FIGS. 7A and 7B, and FIG. 13, where the wiring applying the high power supply potential is set electrically floating and the potentials of the input and output terminals of the CMOS inverters are made equal to the low power supply potential in a period during which power supply stops, and potentials corresponding to data held at the nodes are applied to the input and output terminals of the CMOS inverters to restart power supply, leakage current is likely to flow through the transistor PD1 and the transistor PD2; thus, the potential of the node NET1 might not be increased sufficiently. To easily increase the potential of the node NET1 to increase the potential difference between the node NET1 and the node NET2, measures to increase the on-state current of the OS transistor, reduce the leakage current of the Si transistor, increase the capacitance, or increase the potential of a power supply line are required to operate the semiconductor device normally.

In contrast, in the method for driving the semiconductor device in one embodiment of the present invention, the potentials of the node NET1 and the node NET2 can decrease properly at least to 1.0 V, which is the potential VDD of the wiring VIL. Accordingly, a driving method for a semiconductor device enabling normal operation is obtained without measures to increase the on-state current of the OS transistor for reducing the potentials of the node NET1 and the node NET2.

With the method for driving the semiconductor device in one embodiment of the present invention, the semiconductor device can operate so that leakage current of both the n-channel transistor and the p-channel transistor can be low, thereby realizing a state in which a potential change due to exchange of charge between the node NET2 and the node NVN2 is likely to occur. Accordingly, the semiconductor device can operate normally without measures to reduce the leakage current, increase the capacitance, or increase the potential of a power supply line for lowering the potential of the node NET2.

This embodiment can be implemented in appropriate combination with any of the other embodiments.

Embodiment 2

In this embodiment, top and cross-sectional views of a semiconductor device of one embodiment of the disclosed invention will be described.

First, the top view of the semiconductor device will be described. In this embodiment, for clarifying the top view, a layer where Si transistors are provided, a wiring layer, and a layer where OS transistors are provided are shown in separate diagrams.

Figure 8A:
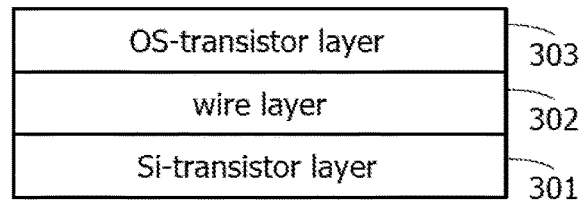
FIG. 8A and FIGS. 8B to 8D are a schematic view and top views of a semiconductor device.

FIG. 8A is a schematic diagram of a layered structure of a layer where Si transistors are provided, a wiring layer, and a layer where OS transistors are provided. A first layer 301 in FIG. 8A is the layer in which Si transistors are provided ("Si-transistor layer" in the diagram). A second layer 302 in FIG. 8A is the wiring layer in which a wiring for supplying power and the like are provided ("wire layer" in the diagram). A third layer 303 in FIG. 8A is the layer in which OS transistors are provided ("OS-transistor layer" in the diagram).

Figure 8B:
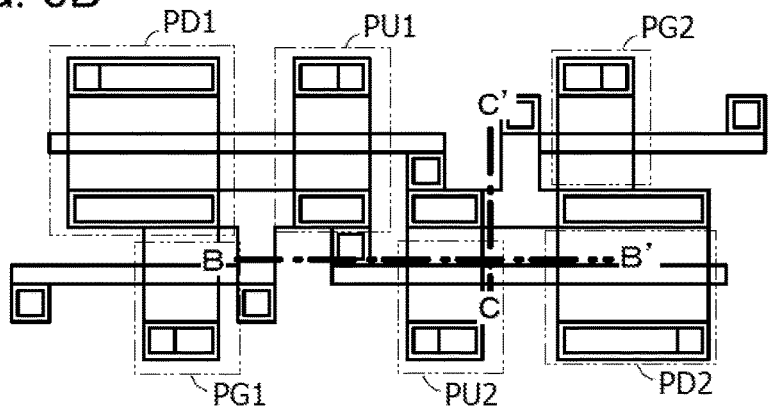

The first layer 301 in FIG. 8A includes the Si transistors shown in the circuit diagram of FIG. 1A, and its top view is shown in FIG. 8B. FIG. 8B illustrates the layout of the transistor PG1, the transistor PG2, the transistor PD1, the transistor PU1, the transistor PD2, and the transistor PU2. FIG. 8B also shows a semiconductor layer, a wiring layer provided in the same layer as a gate electrode, a wiring layer provided in the same layer as source and drain electrodes, and openings for connecting the layers, which are provided to form the Si transistors.

Figure 8C:
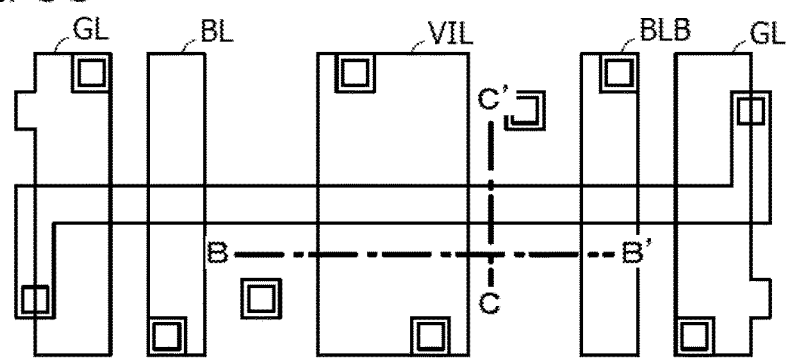

The second layer 302 in FIG. 8A includes the wirings shown in the circuit diagram of FIG. 1A, and its top view is shown in FIG. 8C. FIG. 8C illustrates the layout of the wiring GL, the bit line BL, the wiring VIL, and the inverted bit line BLB. FIG. 8C also shows openings for connecting to another layer.

Figure 8D:
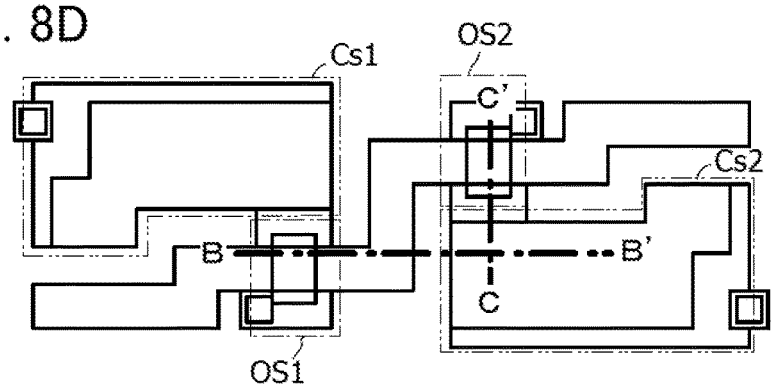

The third layer 303 in FIG. 8A includes the OS transistors and the capacitors shown in the circuit diagram of FIG. 1A, and its top view is shown in FIG. 8D. FIG. 8D illustrates the layout of the transistor OS1, the transistor OS2, the capacitor Cs1, and the capacitor Cs2. FIG. 8D also shows a semiconductor layer, a wiring layer provided in the same layer as a gate electrode, a wiring layer provided in the same layer as source and drain electrodes, conductive layers forming the capacitor Cs1 and the capacitor Cs2, and openings for connecting the layers, which are provided to form the OS transistors.

Figure 9A:
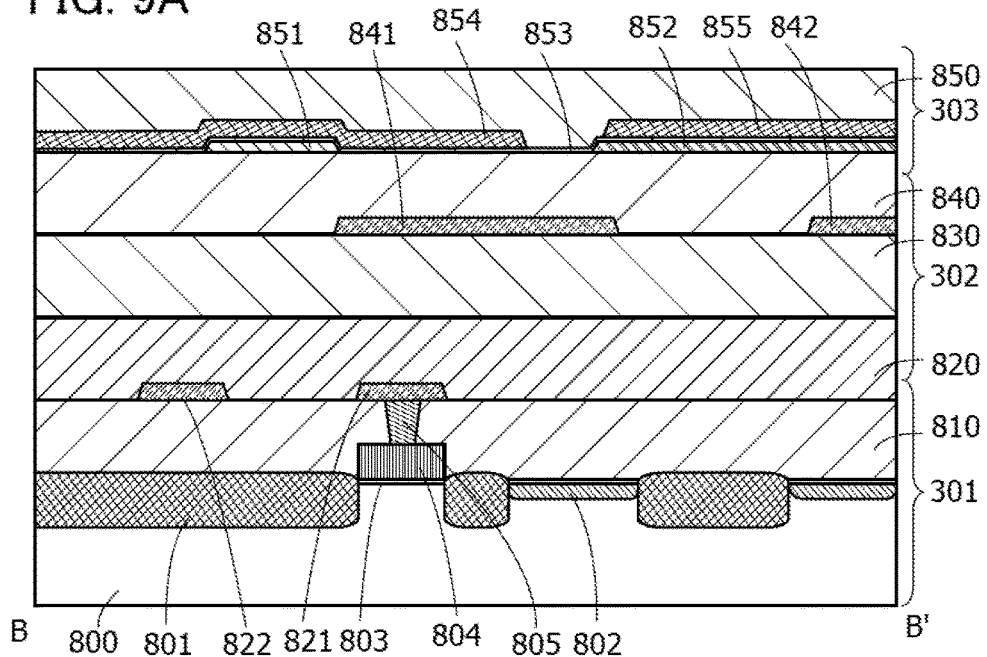
FIGS. 9A and 9B are cross-sectional views of a semiconductor device.
Figure 9B:
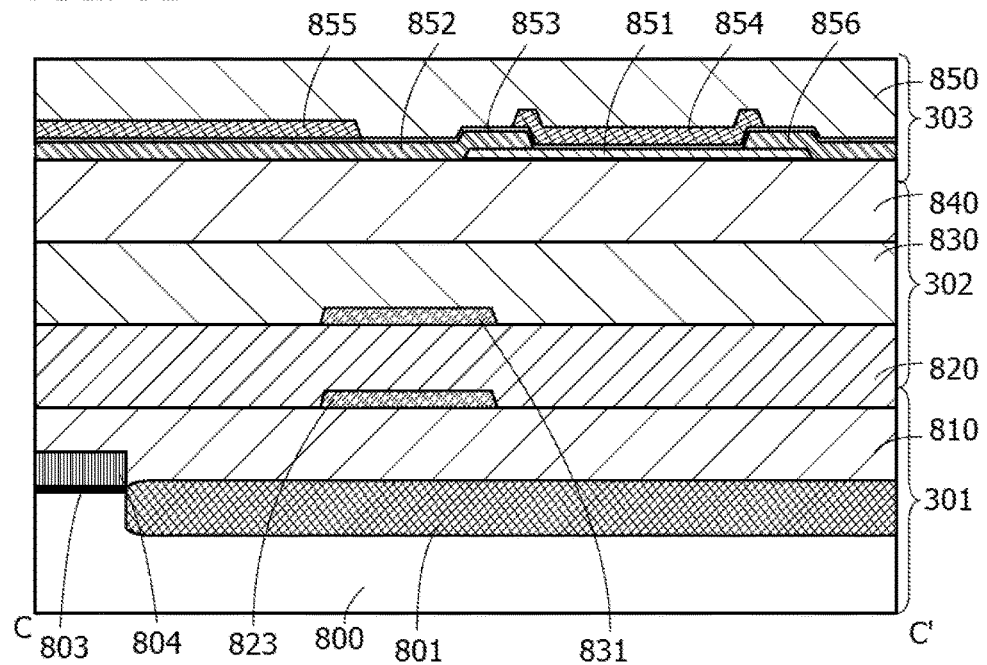

FIG. 9A is a cross-sectional view along dashed-dotted line B-B' in FIGS. 8B to 8D. FIG. 9B is a cross-sectional view along dashed-dotted line C-C' in FIGS. 8B to 8D.

This embodiment shows an example where the transistors in the first layer 301 are formed on a single crystal silicon substrate. The transistor in the first layer 301 may include a thin semiconductor layer of silicon, germanium, or the like in an amorphous, microcrystalline, polycrystalline, or single crystal state.

FIG. 9A shows a semiconductor substrate 800, an element isolation insulating film 801, an impurity region 802, a gate insulating layer 803, a gate electrode 804, a wiring layer 805, an interlayer insulating layer 810, a wiring layer 821, a wiring layer 822, an interlayer insulating layer 820, an interlayer insulating layer 830, an interlayer insulating layer 840, a wiring layer 841, a wiring layer 842, an interlayer insulating layer 850, a semiconductor layer 851, a conductive layer 852, a gate insulating layer 853, a conductive layer 854, and a conductive layer 855.

FIG. 9B shows the semiconductor substrate 800, the element isolation insulating film 801, the gate insulating layer 803, the gate electrode 804, a wiring layer 823, the interlayer insulating layer 810, the interlayer insulating layer 820, the interlayer insulating layer 830, a wiring layer 831, the interlayer insulating layer 840, the interlayer insulating layer 850, the semiconductor layer 851, the conductive layer 852, the gate insulating layer 853, the conductive layer 854, the conductive layer 855, and a conductive layer 856.

The semiconductor substrate 800 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate).

The transistors in the first layer 301 are electrically isolated from each other by the element isolation insulating film 801. The element isolation insulating film 801 can be formed by a local oxidation of silicon (LOCOS) method, a trench isolation method, or the like.

The impurity region 802 is formed in such a manner that an impurity element imparting p-type conductivity or an impurity element imparting n-type conductivity is added to the semiconductor substrate 800 by ion doping, ion implantation, or the like as appropriate.

The gate insulating layer 803 is formed in such a manner that heat treatment is performed to form a silicon oxide film on the surface of the semiconductor substrate 800 and then the silicon oxide film is partly etched. Alternatively, the gate insulating layer 803 is formed in such a manner that silicon oxide, silicon oxynitride, metal oxide such as hafnium oxide, which is a high dielectric constant material (also referred to as high-k material), or the like is formed by CVD, sputtering, or the like and then is partly etched.

For the gate electrode 804, the wiring layers 805, 821, 822, 823, 831, 841, and 842, and the conductive layers 852, 854, 855, and 856, a metal material such as aluminum, copper, titanium, tantalum, or tungsten is preferably used. Alternatively, polycrystalline silicon to which an impurity such as phosphorus is added can be used. As the formation method, a variety of film formation methods such as evaporation, PE-CVD, sputtering, and spin coating can be used.

Each of the interlayer insulating layers 810, 820, 830, 840, and 850 is preferably a single layer or a multilayer including an inorganic insulating layer or an organic insulating layer. The inorganic insulating layer is preferably a single layer or a multilayer formed using any of a silicon nitride film, a silicon oxynitride film, a silicon nitride oxide film, and the like. The organic insulating layer is preferably a single layer or a multilayer containing polyimide, acrylic, or the like. There is no particular limitation on a method for forming each of the interlayer insulating layers 810, 820, 830, 840, and 850; for example, sputtering, MBE, PE-CVD, pulse laser deposition, or atomic layer deposition (ALD) can be employed as appropriate.

The semiconductor layer 851 can be a single layer or a stacked layer formed using an oxide semiconductor. The semiconductor layer 851 can be an oxide film containing at least indium, gallium, and zinc, such as an In—Ga—Zn-based oxide (also expressed as IGZO). Note that the In—Ga—Zn-based oxide means an oxide containing In, Ga, and Zn and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The semiconductor layer 851 can be formed by sputtering, ALD, evaporation, coating, or the like.

The gate insulating layer 853 is preferably an inorganic insulating layer with a single-layer or multilayer structure. The gate insulating layer 853 preferably has the effect of supplying oxygen to the semiconductor layer 851.

In the top view of the semiconductor device described in this embodiment, as for the transistor PD1, the transistor PU1, the transistor PD2, and the transistor PU2 that constitute the CMOS inverters, the n-channel transistors are larger in size than the p-channel transistors. This layout results in a larger static noise margin of SRAM included in the semiconductor device.

If the size of the n-channel transistors in one embodiment of the present invention, which is described in Embodiment 1, is made large as in the top view of the semiconductor device in this embodiment, leakage current at the time of data restoring increases and normal operation becomes difficult to achieve. According to another embodiment of the present invention, which is described in this embodiment, it is possible to obtain a method for driving a semiconductor device that achieves normal operation regardless of the amount of current flowing through the n-channel transistors. Thus, the semiconductor device having the layout of this embodiment can employ the driving method enabling normal operation as well as having the effect of increasing the static noise margin of SRAM.

This embodiment can be implemented in appropriate combination with any of the other embodiments.

Embodiment 3

This embodiment will explain an oxide semiconductor layer that can be used as a semiconductor layer of the OS transistor described in the foregoing embodiments.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For this reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of $1 \times 10^{17}/cm^3$ or lower, $1 \times 10^{16}/cm^3$ or lower, $1 \times 10^{15}/cm^3$ or lower, $1 \times 10^{14}/cm^3$ or lower, or $1 \times 10^{13}/cm^3$ or lower.

The transistor including an i-type or substantially i-type oxide semiconductor film can have extremely favorable leakage current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or higher, 2 V or higher, or 3 V or higher.

A formed oxide semiconductor may be in a non-single-crystal state, for example. The non-single-crystal state is structured, for example, by at least one of c-axis aligned crystal (CAAC), polycrystal, microcrystal, and an amorphous part.

An oxide semiconductor may include CAAC, for example. Note that an oxide semiconductor including CAAC is referred to as a c-axis aligned crystalline oxide semiconductor (CAAC-OS).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image of the CAAC-OS obtained with a TEM, a boundary between the crystal parts or a grain boundary is not clearly observed in some cases. Since a clear grain boundary does not exist in the CAAC-OS, segregation of an impurity, high density of defect states, or a reduction in electron mobility is unlikely to occur, for example.

For example, the CAAC-OS sometimes includes a plurality of crystal parts whose c-axes are aligned in a direction parallel to a normal vector of a surface where the CAAC-OS is formed or a normal vector of a surface of the CAAC-OS. When the CAAC-OS is analyzed by an out-of-plane method with an X-ray diffraction (XRD) apparatus, a peak at 2θ of around 31° which shows alignment appears in some cases. Furthermore, for example, spots (luminescent spots) are observed in an electron diffraction pattern of the CAAC-OS in some cases. Note that an electron diffraction pattern obtained with an electron beam having a beam diameter of 10 nmφ or smaller or 5 nmφ or smaller is called a nanobeam electron diffraction pattern. In the CAAC-OS, for example, among crystal parts, the directions of the a-axis and the b-axis of one crystal part are sometimes different from those of another crystal part. In the CAAC-OS, for example, c-axes are aligned and a-axes and/or b-axes are not macroscopically aligned in some cases.

In each of the crystal parts included in the CAAC-OS, for example, the c-axis is aligned in a direction parallel to a normal vector of a surface where the CAAC-OS is formed or a normal vector of a surface of the CAAC-OS, metal atoms are arranged in a triangular or hexagonal pattern when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°, and the term "parallel" includes a range from −10° to 10°, preferably from −5° to 5°.

The CAAC-OS can be formed by the reduction in the density of defect states, for example. In an oxide semiconductor, for example, oxygen vacancies are defect states. Oxygen vacancies serve as trap levels or serve as carrier generation sources when hydrogen is trapped therein. In order to form the CAAC-OS, it is important to prevent oxygen vacancies from being generated in the oxide semiconductor, for example. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, in the transistor including the oxide semiconductor in the channel formation region, electrical characteristics hardly change and the reliability is high in some cases. A charge trapped by the trap states in the oxide semiconductor takes a long time to disappear and may behave like a fixed charge. Consequently, the transistor that contains the oxide semiconductor having a high density of trap states in the channel formation region has unstable electrical characteristics in some cases.

With the use of the highly purified intrinsic or substantially highly purified intrinsic CAAC-OS in a transistor, a change in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor ranges from 1 nm to 100 nm, or from 1 nm to 10 nm, for example. A microcrystal with a size ranging from 1 nm to 10 nm is specifically referred to as nanocrystal (nc). An oxide semiconductor including nanocrystal is referred to as a nanocrystalline oxide semiconductor (nc-OS). In an image of the nc-OS obtained with a TEM, for example, a boundary between crystal parts is not clearly observed in some cases. Since a clear grain boundary does not exist in an image of the nc-OS obtained with a TEM, for example, segregation of an impurity is unlikely to occur. In the nc-OS, since a clear grain boundary does not exist, high density of defect states or a reduction in electron mobility is unlikely to occur, for example.

In the nc-OS, for example, a microscopic region (e.g., a region ranging from 1 nm to 10 nm) has a periodic atomic order occasionally. Furthermore, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor depending on an analysis method, for example. When the nc-OS is analyzed by an out-of-plane method with an XRD apparatus using an X-ray having a beam diameter larger than the diameter of a crystal part, a peak that shows alignment does not appear in some cases. Moreover, for example, a halo pattern is shown in some cases in an electron diffraction pattern of the nc-OS obtained by using an electron beam having a beam diameter larger than the diameter of a crystal part (e.g., a beam diameter of 20 nmφ or more, or 50 nmφ or more). For example, spots are shown in some cases in a nanobeam electron diffraction pattern of the nc-OS obtained by using an electron beam having a beam diameter smaller than or equal to the diameter of a crystal part (e.g., a beam diameter of 10 nmφ or less, or 5 nmφ or less). In a nanobeam electron diffraction pattern of the nc-OS, for example, regions with high luminance in a circular pattern and/or a plurality of spots are shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly arranged, the nc-OS has higher density of defect states than the CAAC-OS.

Note that an oxide semiconductor film may be a mixed film including two or more of a CAAC-OS, a polycrystalline oxide semiconductor, a microcrystalline oxide semiconductor, and an amorphous oxide semiconductor. The mixed film may include at least two of an amorphous oxide semiconductor region, a microcrystalline oxide semiconductor region, a polycrystalline oxide semiconductor region, and a CAAC-OS region, for example. Moreover, the mixed film may have a stacked structure of at least two of an amorphous oxide semiconductor region, a microcrystalline oxide semiconductor region, a polycrystalline oxide semiconductor region, and a CAAC-OS region.

This embodiment can be implemented in appropriate combination with any of the other embodiments.

Embodiment 4

In this embodiment, application examples of the semiconductor device described in the foregoing embodiment to an electronic component and to an electronic device including the electronic component will be described with reference to FIGS. 10A and 10B and FIGS. 11A to 11E.

Figure 10A:
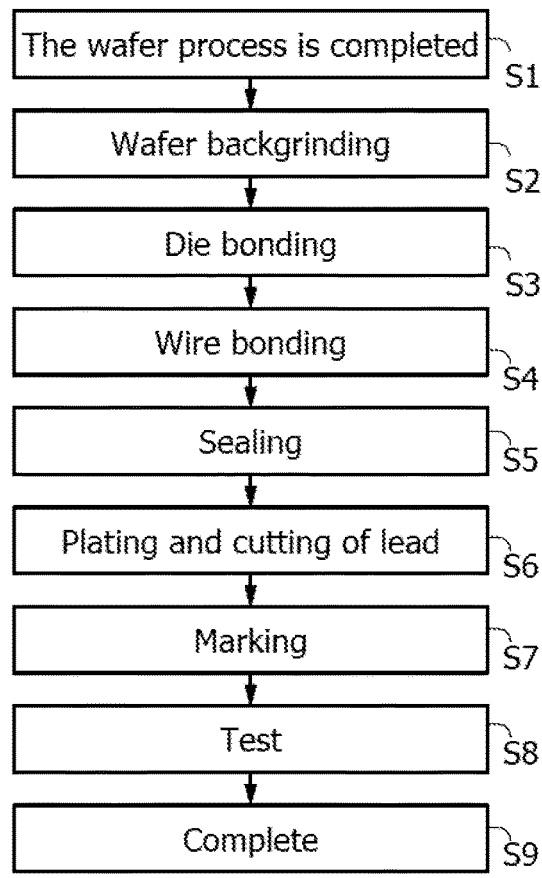
FIG. 10A is a flowchart showing fabrication steps of a semiconductor device.

FIG. 10A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIGS. 8A to 8D and FIGS. 9A and 9B of Embodiment 2 is completed by integrating detachable components on a printed circuit board through the assembly process (post-process).

The post-process can be completed through steps shown in FIG. 10A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the circuit portion and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes a semiconductor device that operates with the driving method described in the foregoing embodiment, it is possible to obtain an electronic component including the semiconductor device that reduces a malfunction due to effects of the on-state current and leakage current of transistors, capacitance of capacitors, a potential of a power supply line, and the like and thus can operate normally even when elements are scaled down. The electronic component is highly reliable.

Figure 10B:
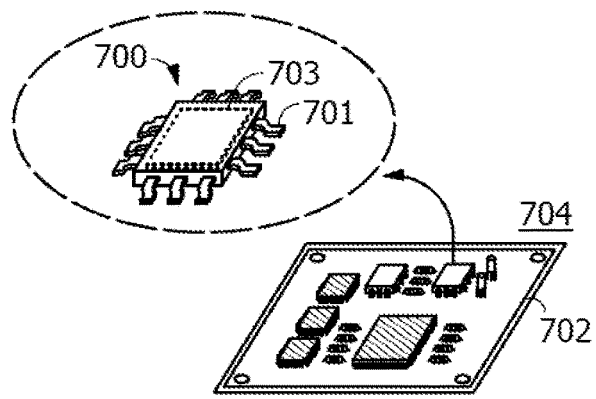
FIG. 10B is a perspective schematic view of the semiconductor device.

FIG. 10B is a perspective schematic diagram of a completed electronic component. FIG. 10B shows a perspective schematic diagram of a quad flat package (QFP) as an example of the electronic component. An electronic component 700 illustrated in FIG. 10B includes a lead 701 and a semiconductor device 703. The electronic component 700 in FIG. 10B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 11A:
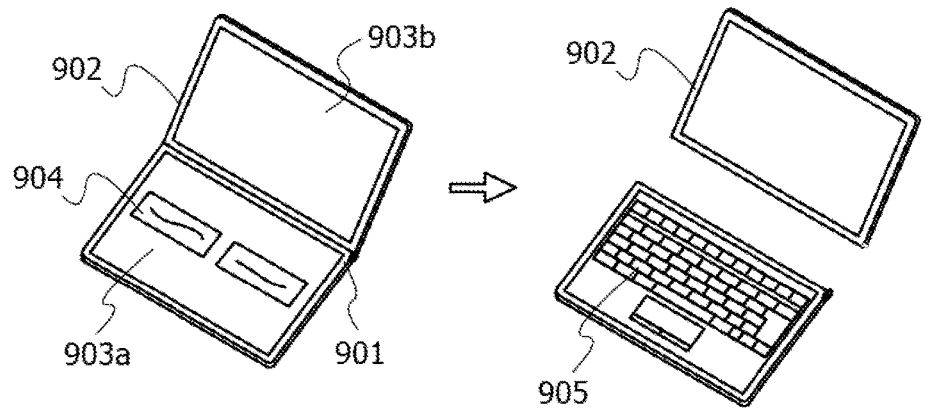
FIGS. 11A to 11E each illustrate an electronic device including a semiconductor device.

FIG. 11A illustrates a portable information appliance that includes a housing 901, a housing 902, a first display portion 903a, a second display portion 903b, and the like. At least one of the housings 901 and 902 includes the circuit board including the semiconductor device of the foregoing embodiment. Thus, it is possible to obtain a highly reliable portable information appliance.

Note that the first display portion 903a is a panel having a touch input function, and for example, as illustrated in the left of FIG. 11A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 11A. Thus, letters can be input quickly by key input as in a conventional information appliance, for example.

One of the first display portion 903a and the second display portion 903b can be detached from the portable information appliance as shown in the right of FIG. 11A. Providing the second display portion 903b with a touch input function makes the information appliance convenient to carry because the weight can be further reduced and the information appliance can operate with one hand while the other hand supports the housing 902.

The portable information appliance in FIG. 11A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 11A may transmit and receive data wirelessly. Through wireless communication, desired book data or the like can be purchased and downloaded from an e-book server.

Furthermore, the housing 902 illustrated in FIG. 11A may be equipped with an antenna, a microphone function, or a wireless communication function to be used as a mobile phone.

Figure 11B:
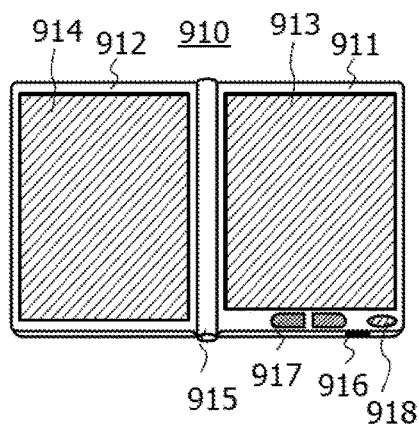

FIG. 11B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The circuit board including the semiconductor device of the foregoing embodiment is provided in at least one of the housings 911 and 912. Consequently, it is possible to obtain a highly reliable e-book reader.

Figure 11C:
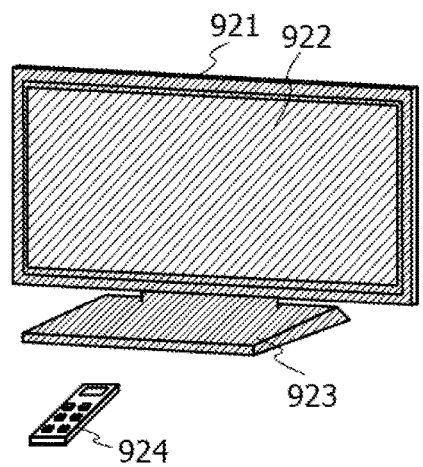

FIG. 11C illustrates a television device including a housing 921, a display portion 922, a stand 923, and the like. The television device can be controlled by a switch of the housing 921 and a separate remote controller 924. The circuit board including the semiconductor device of the foregoing embodiment is mounted on the housings 921 and the remote controller 924. Thus, it is possible to obtain a highly reliable television device.

Figure 11D:
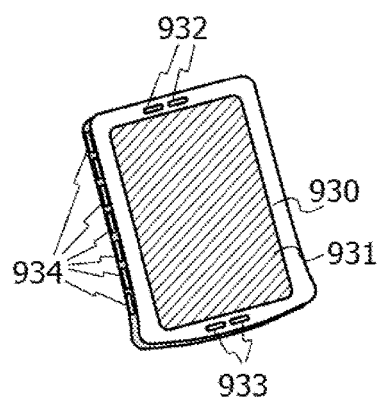

FIG. 11D illustrates a smartphone in which a main body 930 is provided with a display portion 931, a speaker 932, a microphone 933, an operation key 934, and the like. The circuit board including the semiconductor device of the foregoing embodiment is provided in the main body 930. Thus, it is possible to obtain a highly reliable smartphone.

Figure 11E:
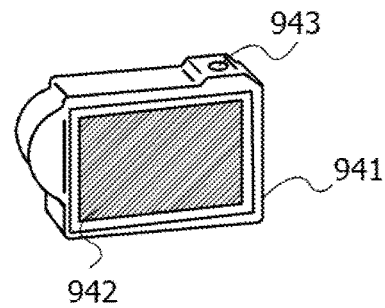

FIG. 11E illustrates a digital camera including a main body 941, a display portion 942, an operation switch 943, and the like. The circuit board including the semiconductor device of the foregoing embodiment is provided in the main body 941. Thus, it is possible to obtain a highly reliable digital camera.

As described above, the electronic devices shown in this embodiment incorporate the circuit board including the semiconductor device of the foregoing embodiment, thereby having high reliability.

This application is based on Japanese Patent Application serial No. 2013-227349 filed with Japan Patent Office on Oct. 31, 2013, the entire contents of which are hereby incorporated by reference.

What is claimed is:

1. A method for driving a semiconductor device comprising an SRAM, a first transistor electrically connected to an input terminal of the SRAM, and a second transistor electrically connected to an output terminal of the SRAM comprising the steps of:
    applying a first potential to a first power supply line;
    applying a floating potential to a second power supply line;
    applying a high-level potential to gates of the first transistor and the second transistor; and
    applying a second potential to the second power supply line when the high-level potential is applied to the gates of the first transistor and the second transistor,
    wherein the first potential is higher than the second potential,
    wherein the SRAM comprises a third transistor, a fourth transistor, a fifth transistor and a sixth transistor,
    wherein the first power supply line is directly electrically connected to each of the third transistor and the fourth transistor, and
    wherein the second power supply line is directly electrically connected to each of the fifth transistor and the sixth transistor.

2. The method for driving a semiconductor device, according to claim 1,
    wherein the first transistor is electrically connected to a first capacitor, and
    wherein the second transistor is electrically connected to a second capacitor.

3. The method for driving a semiconductor device, according to claim 1, wherein each of the first transistor and the second transistor is an n-channel transistor.

4. The method for driving a semiconductor device, according to claim 1, wherein each of the first transistor and the second transistor comprises an oxide semiconductor layer comprising a channel formation region.

5. The method for driving a semiconductor device, according to claim 4, wherein the oxide semiconductor layer comprises a c-axis aligned crystal.

6. The method for driving a semiconductor device, according to claim 1, wherein the SRAM comprises a silicon semiconductor layer comprising a channel formation region.

7. The method for driving a semiconductor device, according to claim 1, further comprising an insulating layer over the SRAM,
    wherein each of the first transistor and the second transistor is over the insulating layer.

* * * * *